United States Patent
Lee (10) Patent No.: US 7,324,377 B2
(45) Date of Patent: Jan. 29, 2008

(54) APPARATUS AND METHOD FOR PROGRAMMING AND ERASING VIRTUAL GROUND EEPROM WITHOUT DISTURBING ADJACENT CELLS

(75) Inventor: Ming Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 171 days.

(21) Appl. No.: 10/976,668

(22) Filed: Oct. 29, 2004

(65) Prior Publication Data

US 2006/0092702 A1    May 4, 2006

(51) Int. Cl.
G11C 11/34    (2006.01)
G11C 16/04    (2006.01)

(52) U.S. Cl. .................. 365/185.16; 365/185.21; 365/185.29; 365/185.28; 365/185.02; 365/185.26

(58) Field of Classification Search ........... 365/185.02, 365/185.03, 185.16, 185.29, 185.2, 185.21, 365/185.23, 185.24, 185.25, 185.26, 185.28, 365/185

See application file for complete search history.

(56) References Cited

U.S. PATENT DOCUMENTS 5,168,334 A * 12/1992 Mitchell et al. ............ 257/324
6,175,519 B1    1/2001 Lu et al.
6,177,703 B1    1/2001 Cunningham
6,566,699 B2    5/2003 Eitan
6,570,790 B1    5/2003 Harari
6,657,894 B2 * 12/2003 Yeh et al. ............... 365/185.16
6,829,171 B2 * 12/2004 Ooishi .................... 365/185.21
2004/0145950 A1 * 7/2004 Yeh et al. ............... 365/185.28
2004/0170063 A1 * 9/2004 Tsai et al. ............... 365/185.29

OTHER PUBLICATIONS

Yeh, C.C. et al. "PHINES: a novel low power program/erase, small pitch, 2-bit per cell flash memory" Electron Devices Meeting, 2002. IEDM '02. pp. 931-934.*

* cited by examiner

Primary Examiner—Amir Zarabian
Assistant Examiner—Michael Weinberg
(74) Attorney, Agent, or Firm—Stout, Uxa, Buyan & Mullins, LLP

(57) ABSTRACT

A method is described for erasing a selected data region in an NROM cell that is a member of a virtual ground NROM EEPROM array. The method provides that erasing the selected data region does not disturb the program state of unselected data regions.

21 Claims, 7 Drawing Sheets

APPARATUS AND METHOD FOR PROGRAMMING AND ERASING VIRTUAL GROUND EEPROM WITHOUT DISTURBING ADJACENT CELLS

BACKGROUND OF THE INVENTION

1. Field of the Invention

The present invention relates generally to methods of operating semiconductor memory cells and, more particularly, to a method for erasing nitride read only memory cells.

2. Description of Related Art

A non-volatile semiconductor memory device is designed to maintain programmed information even in the absence of electrical power. Read only memory (ROM) is a non-volatile memory commonly used in electronic equipment such as microprocessor-based digital electronic equipment and portable electronic devices.

ROM devices typically include multiple memory cell arrays. Each memory cell array may be visualized as including intersecting word lines and bit lines. Each word and bit line (or bit line pair) intersection can correspond to one bit of memory. In mask programmable metal oxide semiconductor (MOS) ROM devices, the presence or absence of an active MOS transistor at word and bit line intersections distinguishes between a stored logic '0' and logic '1'.

A programmable read only memory (PROM) is similar to the mask programmable ROM except that a user may store data values (i.e., program the PROM) using a PROM programmer. A PROM device is typically manufactured with fusible links at all word and bit line intersections. This corresponds to having all bits at a particular logic value, typically logic '1'. The PROM programmer is used to set desired bits to the opposite logic value, typically by applying a high voltage that vaporizes the fusible links corresponding to the desired bits. A typical PROM device can only be programmed once.

An erasable programmable read only memory (EPROM) is programmable like a PROM, but can also be erased (e.g., to an all logic '1's state) by exposing it to ultraviolet light. A typical EPROM device has a floating gate MOS transistor at word and bit line intersections. Each MOS transistor has two gates: a floating gate and a non-floating or control gate. The floating gate is not electrically connected to any conductor, and is surrounded by a high impedance insulating material. To program the EPROM device, a high voltage is applied to the non-floating gate at each bit location where a logic value (e.g., a logic '0') is to be stored. This causes a breakdown in the insulating material and allows a negative charge to accumulate on the floating gate. When the high voltage is removed, the negative charge remains on the floating gate. During subsequent read operations, the negative charge prevents the MOS transistor from forming a low resistance channel between a drain bit line and a source bit line (i.e., from turning on) when the transistor is selected.

An EPROM integrated circuit is normally housed in a package having a quartz lid, and the EPROM is erased by exposing the EPROM integrated circuit to ultraviolet light passed through the quartz lid. The insulating material surrounding the floating gates becomes slightly conductive when exposed to the ultraviolet light, allowing the accumulated negative charges on the floating gates to dissipate.

A typical electrically erasable programmable read only memory (EEPROM) device is similar to an EPROM device except that individual stored bits may be erased electrically. The floating gates in a EEPROM device are surrounded by a much thinner insulating layer, and accumulated negative charges on the floating gates can be dissipated by applying a voltage having a polarity opposite that of the programming voltage to the non-floating gates.

A relatively recent development in non-volatile memory is localized trapped charge devices. While these devices are commonly referred to as nitride read only memory (NROM) devices, the acronym "NROM" is a part of a combination trademark of Saifun Semiconductors Ltd. (Netanya, Israel).

NROM devices are known that can store multiple bits per cell. According to a typical implementation, charge can be stored in two regions of a nitride layer that forms part of a typical NROM cell. Further, a multiple-bit NROM cell may be formed of a single transistor, leading to densities of NROM arrays that are higher than those achieved by many floating gate memories.

Prior art forms of NROM arrays include EEPROMs and flash EEPROMs. A distinction is made herein between EEPROMs and flash EEPROMs in that EEPROM cells may be programmed and erased individually whereas flash EEPROM cells are not erased individually, but are erased in blocks. Fabrication of NROM EEPROM arrays normally requires that isolation regions be implemented between individual EEPROM cells in order that potentials applied to erase a given cell do not influence the program state of neighboring EEPROM cells. NROM flash EEPROM arrays do not require individual isolation regions because cells are erased block by block, not individually. The requirement for individual isolation regions in NROM EEPROM arrays wastes semiconductor area and decreases the density of NROM EEPROM arrays when compared with the density of NROM flash EEPROM arrays that do not require individual isolation regions.

A need thus exists in the prior art for an NROM EEPROM array without isolation regions. A further need exists for a method of erasing NROM EEPROM cells that does not disturb neighboring cells in the array.

SUMMARY OF THE INVENTION

The present invention addresses these needs by providing a virtual ground array of nitride read only memory (NROM) cells without isolation regions. Each cell in the array comprises first and second data regions. The invention herein disclosed further provides a method of erasing a first data region in a selected cell in the array. The method does not disturb a second data region in the selected cell, nor does it disturb data stored in data regions of unselected cells in the array.

The method of providing a virtual ground array of nitride read only memory cells comprises providing a substrate and arranging the array of cells in the substrate according to rows and columns. Each cell in the array comprises a source, a drain, a channel formed between the source and drain, a first isolating layer above the channel, a charge trapping layer above the first isolating layer, a second isolating layer above the charge trapping layer, and a gate above the second isolating layer. The charge trapping layer normally comprises a source side data region and a drain side data region. The gates of cells in each row are coupled to a common word line. Cells are configured so that the source of each cell in a row coincides with the drain of an adjacent cell in the row. The sources of cells in a column are connected to form a common bit line.

An embodiment of the method for erasing a first data region in a selected cell comprises erasing the drain side data region. The drain side data region may be erased by applying a first potential to a first bit line connected to the source of the selected cell. A second potential is applied to a second bit line connected to the drain of the selected cell. A third potential is applied to a first word line connected to the gate of the selected cell, and a fourth potential is applied to one or more bit lines that are connected to one or more cells that are adjacent to the selected cell. All applied potentials are referenced to the substrate. Potentials are chosen such that a difference between the second potential and the third potential is sufficient to cause holes to be injected from the drain of the selected cell into the drain side data region of the selected cell. This injection may cause a data value to be erased from the drain side data region of the selected cell. The potentials further are chosen such that a difference between the fourth potential and the first potential is not sufficient to inject charges into any other data region in the same row as the selected cell.

An embodiment of the present invention comprises a virtual ground nitride read only memory electrically erasable programmable read-only memory (EEPROM) cell array comprising a plurality of nitride read only memory cells, each cell including a gate, a source, a drain, a substrate, a channel region in the substrate formed between the source and drain, two isolating layers formed on the channel region, and a trapping layer formed between the isolating layers. The trapping layer has sufficiently low conductivity to prevent spreading of charge therein. In an erase state, the trapping layer stores no excess or only a small amount of electrons.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not provide a complete description of a method of operating NROM cells. The present invention may be practiced in conjunction with various methods of operation that are conventionally used in the art, and only so much of the commonly practiced method steps are included herein as are necessary to provide an understanding of the present invention. The present invention has applicability in the field of semiconductor memory devices and operating methods in general. For illustrative purposes, however, the following description pertains to an array of NROM cells capable of storing data and to a method of erasing data stored therein.

Figure 1A:
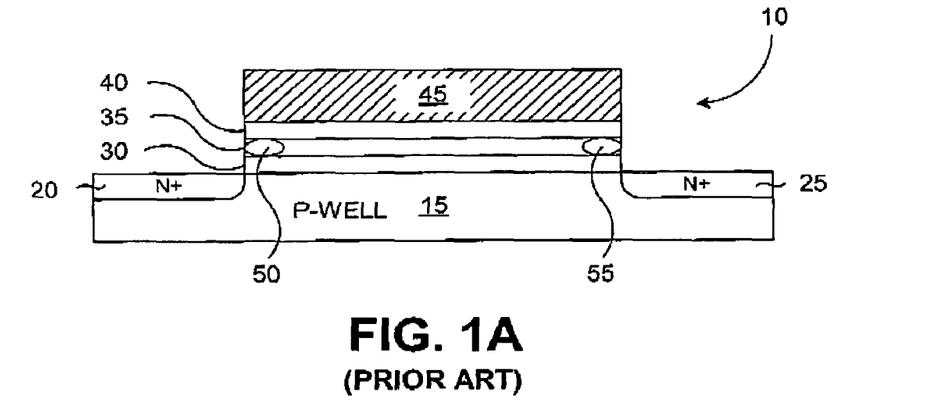
FIG. 1A is a cross-sectional diagram of a representative embodiment of an NROM cell.

Referring more particularly to the drawings, FIG. 1A is a cross-sectional diagram of a representative embodiment of an NROM cell 10. The illustrated example comprises a semiconductor substrate 15 that may be formed of lightly doped P-type silicon to form a P-well. Source 20 and drain 25 regions that typically comprise heavily doped N-type material, often denoted as N+, are formed in the substrate. A channel may form in the substrate between the source 20 and drain 25 regions. It should be noted that the length of the channel in the embodiments of NROM cells described herein is "short." That is, the distance between the source 20 and the drain 25 regions is short enough to enable a disturb-free erase operation as disclosed herein. Typically, the channel length is shorter than 0.25 µm. A first isolating layer 30 overlies the channel, and a charge trapping layer 35 overlies the first isolating layer 30. The charge trapping layer may be formed of silicon nitride. A second isolating layer 40 overlies the charge trapping layer, and a conducting gate 45 overlies the second isolating layer 40. In typical embodiments the first and second insulating layers 30 and 40 are formed of silicon dioxide. The gate 45 may be formed of polysilicon.

Figure 1B:
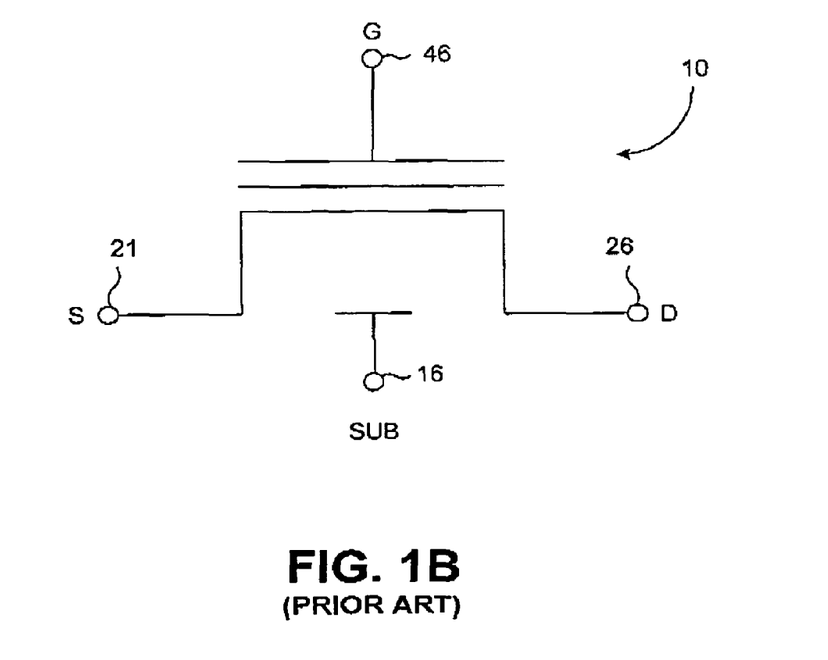
FIG. 1B is a schematic representation of the NROM cell illustrated in FIG. 1A.

FIG. 1B is a schematic representation of the single NROM cell 10. Source terminal 21, drain terminal 26, gate terminal 46, and substrate terminal 16 schematically represent the source 20, drain 25, gate 45, and substrate 15 illustrated in FIG. 1A.

FIG. 1A further illustrates two data regions referred to as source side data region 50 and drain side data region 55 located in the charge trapping layer 35 near, respectively, the source 20 and the drain 25. A method disclosed herein can be used to store charge in one of these data regions, for example, drain side data region 55. The stored charge can be highly localized and tends not to spread throughout the charge trapping layer 35 because of the very low conductivity of the material that forms the charge trapping layer 35. Accordingly, the NROM cell is capable of storing separate data values in each of at least two data regions, which comprise in the illustrated embodiment source side data region 50 and drain side data region 55. In typical embodiments each source side data region 50 and drain side data region 55 is capable of storing one of two possible data values, corresponding to one bit of information. These typical embodiments therefore are capable of storing a total of two bits per NROM cell. In modified embodiments, each of the source side data region 50 and the drain side data region 55 is capable of storing more than two possible data values. For example, each source side data region 50 and each drain side data region 55 may be capable of storing four possible data values, corresponding to four bits per NROM cell.

In a typical mode of operation, an NROM cell such as the device illustrated in FIG. 1B may be biased with a positive supply voltage, e.g. about 5 V, applied from drain terminal 26 to source terminal 21 with the source terminal 21 connected to the substrate terminal 16. Under this bias condition, applying a voltage from gate terminal 46 to source terminal 21 normally results in a current (i.e., a drain current) that can be measured in an external circuit connected to the drain terminal 26. That is, when the voltage applied between the gate terminal 46 and the source terminal 21 (i.e., a gate-to-source voltage) exceeds a level referred to as a threshold potential, $V_t$, a measurable drain current may be observed. Typically, $V_t$ may have a value approximating 2 volts, and a drain current greater than about 15 µA may result when the gate-to-source voltage exceeds the threshold potential, $V_t$. The threshold potential, $V_t$, of an NROM cell may be altered by modifying an amount of charge stored in a data region of the NROM cell. When the threshold potential of an NROM cell has been raised to a level of, for example, about 4 V, the NROM cell may be said to be programmed. One way of raising the threshold potential of an NROM cell is to store a sufficient amount of electrons in a data region of the NROM cell such that the threshold potential is raised in a neighborhood of the data region.

According to the present invention, a data region, for example drain side data region 55, is said to be programmed when the drain side data region 55 contains an amount of electrons sufficient to raise the threshold potential by about 2 volts. Conversely, the drain side data region 55 is said to be erased when the drain side data region 55 contains substantially no excess or only a small amount of electrons. The "no excess or only a small amount of electrons" condition may correspond, for example, to "virgin" silicon nitride material that has been neither programmed nor erased. As another example, "no excess or only a small amount of electrons" may correspond to silicon nitride material that has been programmed by acquiring an excess of electrons and then erased by acquiring a quantity of holes that results in a net "no excess or only a small amount of electrons" condition. The acquired holes may recombine with electrons in the silicon nitride material, or the positively charged holes may act to offset the effect of the negatively charged electrons to produce, in either case, a "no excess or only a small amount of electrons" condition. The $V_t$ of a transistor that has been programmed and erased may be slightly higher than the $V_t$ of a transistor comprising "virgin" silicon nitride.

Figure 2A:
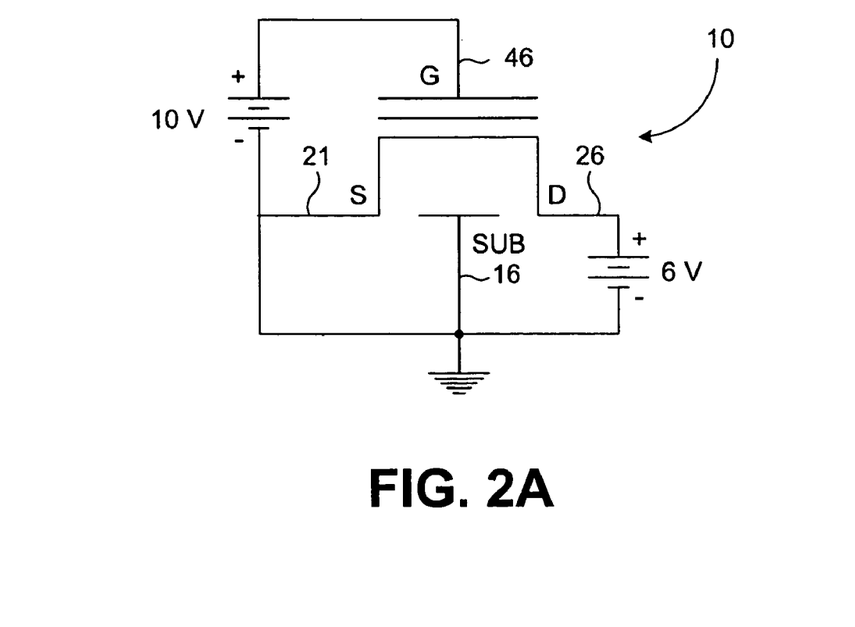
FIG. 2A is a schematic diagram that illustrates an example of a set of bias conditions that can be used to program a data region of an NROM cell.

FIG. 2A is a schematic diagram that illustrates an example of a set of bias conditions that can be used to program drain side data region 55 of the NROM cell 10 illustrated in FIGS. 1A and 1B. According to this example, a large positive potential, e.g. about 10 volts, is applied from gate terminal 46 to source terminal 21 with source terminal 21 connected to the substrate terminal 16, and a medium positive potential, e.g. about 6 volts, is applied from drain terminal 26 to source terminal 21.

Figure 2B:
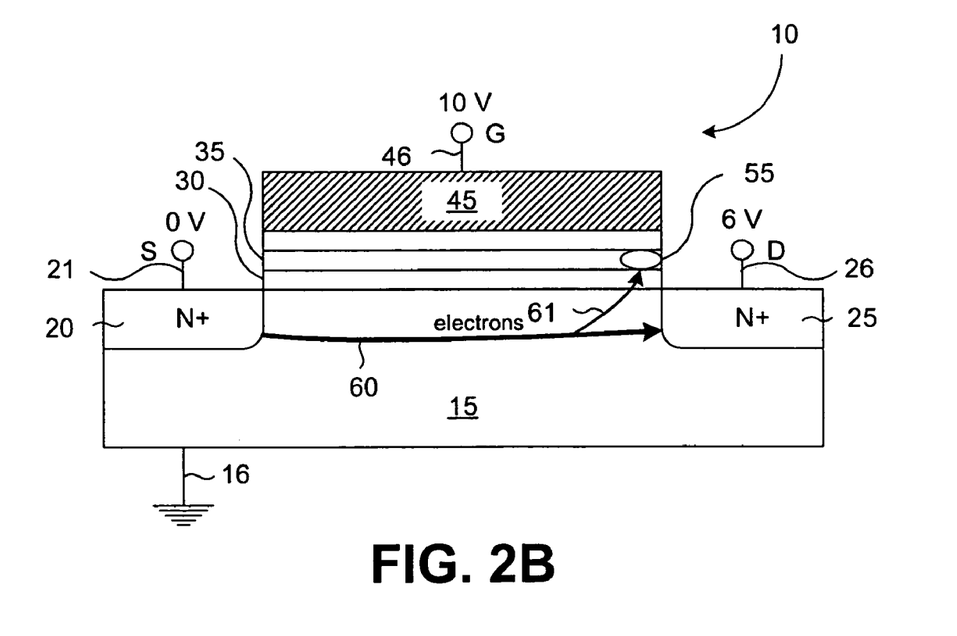
FIG. 2B is a cross-sectional diagram that depicts conditions in an NROM cell when the bias conditions illustrated in FIG. 2A are applied.

FIG. 2B is a cross-sectional diagram that depicts conditions in the NROM cell 10 when the bias conditions illustrated in FIG. 2A are applied. These conditions cause NROM cell 10 to turn on (a cell may be said to be turned on when cell current exceeds a predetermined threshold current value) at a cell current under the potential of the gate terminal 46, whereby potentials of the source terminal 21 and drain terminal 26 are sufficient to program drain side data region 55 by hot electron injection as will now be described. Under the illustrated bias conditions, the channel is in an inverted condition (contains a surplus of electrons). The applied potentials establish vertical and lateral electric fields in the channel that cause electrons to be accelerated from the source 20 toward the drain 25, thereby establishing an electron current 60 in the channel. Typically, the magnitude of the current 60 ranges from about 50 µA to about 300 µA. As the electrons are accelerated toward the drain 25, some of them collide with the substrate lattice and generate electron-hole pairs. These generated electrons, called hot electrons 61, may attain sufficient kinetic energy to surmount the barrier of the isolation layer 30. The hot electrons 61, under the influence of a vertical electric field component resulting in part from the large positive potential applied to the gate 45, may reach the nitride layer 35 where they become trapped. The trapped electrons place drain side data region 55 into a programmed (i.e. a high $V_t$ state) condition.

According to another example, source side data region 50 (FIG. 1A) may be programmed by employing the above method with the same bias potentials, but by reversing the roles of source 20 and drain 25. That is, a medium positive potential is applied from source terminal 21 to drain terminal 26.

Figure 3A:
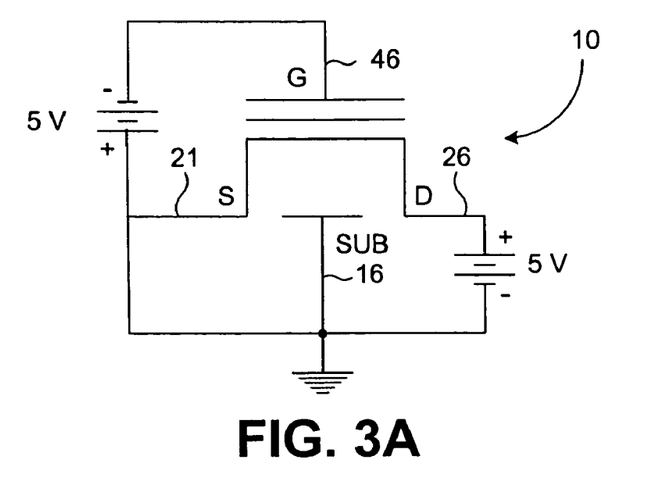
FIG. 3A is a schematic diagram that illustrates an example of a set of bias conditions that can be used to erase a data region of an NROM cell.

FIG. 3A is a schematic diagram that illustrates an example of a set of bias conditions that can be used to erase drain side data region 55 of the NROM cell 10 of FIG. 1B. According to this example, a medium negative potential, e.g. about −5 volts, is applied from gate terminal 46 to source terminal 21 with source terminal 21 connected to the substrate terminal 16, and a medium positive potential, e.g. about 5 volts, is applied from drain terminal 26 to source terminal 21.

Figure 3B:
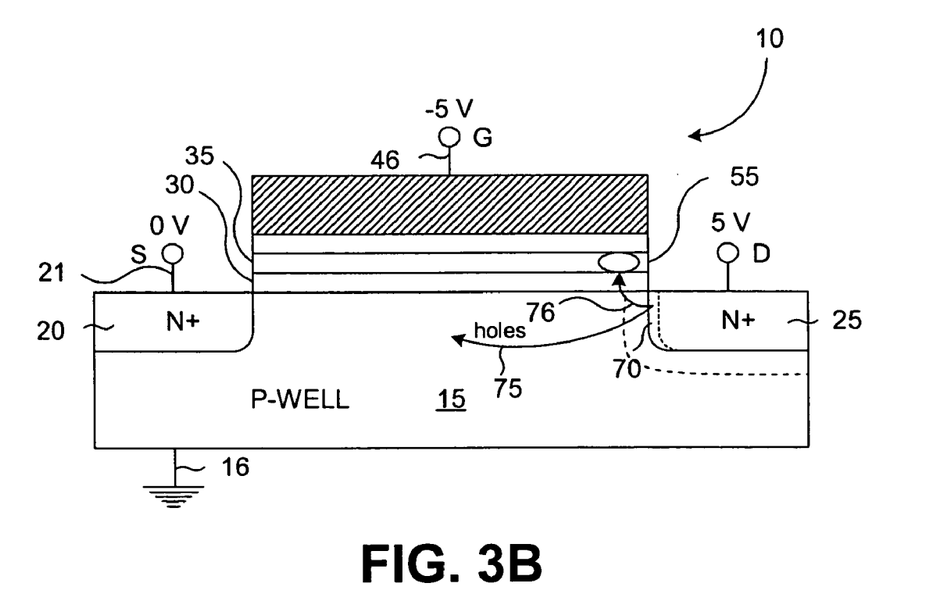
FIG. 3B is a cross-sectional diagram that depicts conditions in an NROM cell when the bias conditions illustrated in FIG. 3A are applied.

FIG. 3B is a cross-sectional diagram that depicts conditions in the NROM cell 10 when the bias conditions illustrated in FIG. 3A are applied. Under these bias conditions, the potential of the substrate 15 is substantially at zero volts, and a deep depletion region 70 forms in and near the drain 25 in a vicinity of the interface between the substrate 15 and the drain 25. Electron-hole pairs are generated and separated within the depletion region 70. Generated electrons are swept to the drain 25 by the electric field of the depletion region 70 while holes are swept to the substrate 15 by the same electric field. The holes that are swept to the substrate 15 form a small current 75, typically ranging from about 0.05 µA to about 1 µA. The negative potential applied to the gate 45 causes the holes 75, generally, to be deflected in the direction of the gate 45, but the majority of holes do not have sufficient kinetic energy to surmount the barrier of the isolation layer 30. Some of the holes near the interface of the substrate 15 and the isolation layer 30, however, termed hot holes 76, are accelerated by the electric field from the depletion region 70 toward the source 20 with sufficient kinetic energy that they are able to surmount the barrier formed by the isolation layer 30. The hot holes 76 may reach the drain side data region 55 of the charge trapping layer 35 where they become trapped because of the low conductivity of the charge trapping layer 35. The trapped holes act to neutralize the effect of electrons in the charge trapping layer 35 as already described, thereby placing the drain side data region 55 into an erased (i.e. a low $V_t$ state) condition.

Figure 4A:
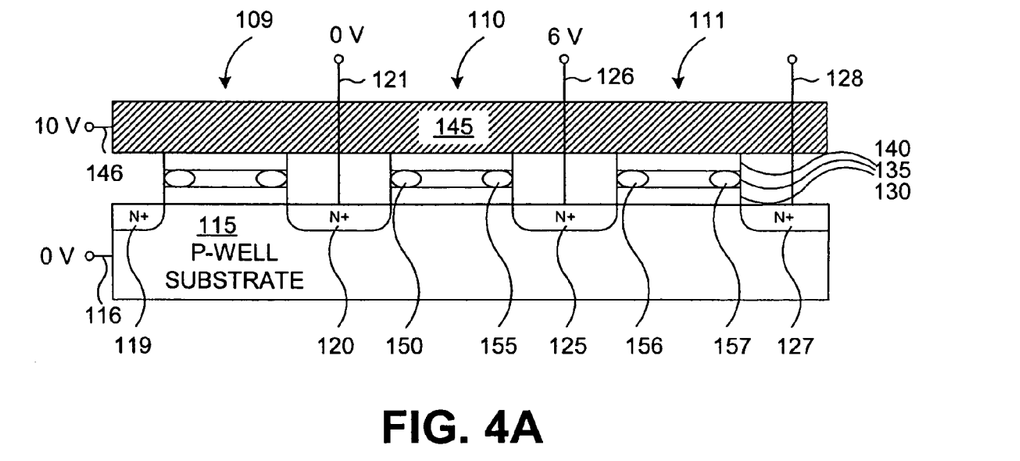
FIG. 4A is a cross-sectional diagram of three NROM cells.

FIG. 4A is a cross-sectional diagram of three NROM cells 109, 110, and 111. In typical embodiments, many more than three NROM cells may be fabricated in the manner shown, but only three NROM cells 109, 110, and 111 are illustrated in FIG. 4A for the sake of simplicity. The illustrated embodiment comprises an NROM cell 110 fabricated in a semiconductor substrate 115 that may comprise lightly doped P-type silicon. The NROM cell 110 further comprises a source region 120 and a drain region 125, denoted as N+, formed of heavily doped N-type material. Adjacent NROM cells 109 and 111 are likewise formed in the substrate 115, NROM cells 109 and 111 being substantially identical to NROM cell 110. NROM cell 109 comprises a source region 119 and a drain region 120. It is noteworthy that the drain region 120 of NROM cell 109 coincides with the source region 120 of NROM cell 110. Similarly, NROM cell 111 comprises a source region 125 and a drain region 127. Again, the drain region 125 of NROM cell 110 coincides with the source region 125 of NROM cell 111. That is, adjacent NROM cells in the illustrated embodiment share source and drain regions, meaning that the same physical region acts as a source for one NROM cell and as a drain for an adjacent NROM cell. This type of configuration has no isolation regions between NROM cells, thereby resulting in a memory device of relatively high density.

The source/drain regions, e.g. source/drain 120, may be formed of buried N+ diffusions in the substrate 115, the buried N+ diffusions extending in a direction orthogonal to the plane of FIG. 4A, i.e. into the paper. These buried N+ diffusions can define bit lines associated with columns of an array of NROM cells as is more particularly described below. Schematically, bit lines, for example bit lines 120, 125, and 127, may be connected to control circuitry (not shown) by respective terminals 121, 126, and 128.

NROM cell 110 is formed as already described in FIG. 4A with a channel in the substrate 115 between the source 120 and drain 125 regions. A first isolating layer 130 overlies the channel of each of the NROM cells 109, 110, and 111. A charge trapping layer 135 overlies each first isolating layer 130, and a second isolating layer 140 overlies each charge trapping layer 135. A conducting word line 145 overlies the second isolating layers 140 and forms a gate for the NROM cell 110. Further, the word line 145, which may be formed of polysilicon, extends to adjacent NROM cells 109 and 111, forming gates for those NROM cells 109 and 111 as well. The word line 145 is constructed so that gates for adjacent NROM cells 109, 110, and 111 are electrically connected together to form a row of NROM cells. Word line 145 may also be connected to control circuitry (not shown) by terminal 146.

Each NROM cell 109, 110, and 111 in the illustrated embodiment further comprises a plurality of data regions that may be programmed or erased using the methods described herein. For example, NROM cell 110 comprises source side data region 150 and drain side data region 155 located in the charge trapping layer 135 near, respectively, the source 120 and drain 125 of NROM cell 110. NROM cell 111 comprises similar source side data region 156 and drain side data region 157. In the illustrated configuration, drain side data region 155 and source side data region 156, for example, are said to be adjacent. Drain side data region 155 can be programmed in the manner described above with reference to FIG. 2B by applying a zero volt potential to the source terminal 121 and substrate terminal 116, a medium positive potential, e.g. 6 about volts, to the drain terminal 126, and a large positive potential, e.g. about 10 volts, to the terminal 146 of the word line 145 that forms a gate for the NROM cell 110. Other source/drain terminals can remain floating. As was described in the discussion of FIG. 2B, these bias conditions cause the injection of hot electrons into drain side data region 155 of the charge trapping layer 135, resulting in the drain side data region 155 being programmed. A similar method, with the roles of source and drain interchanged, may be used to program source side data region 150.

Figure 4B:
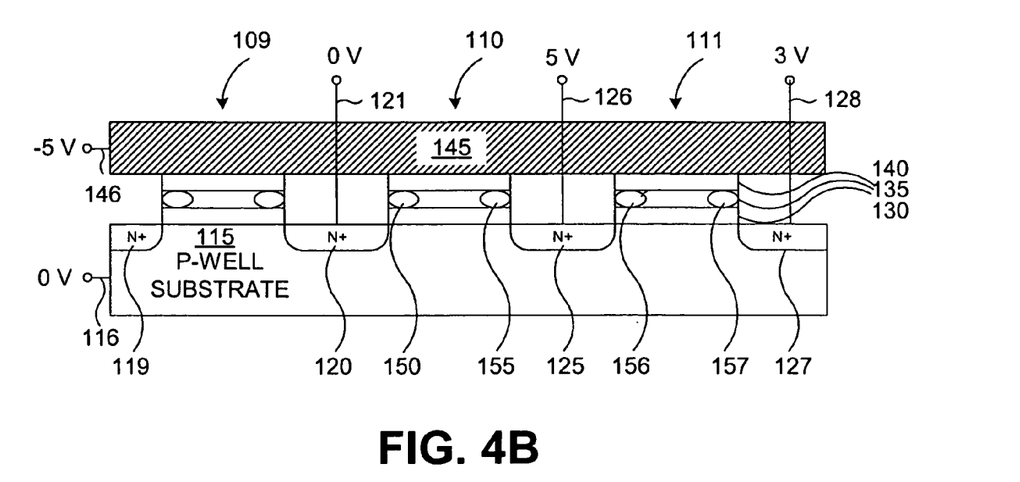
FIG. 4B illustrates bias conditions for erasing a data region near the drain of an NROM cell.

FIG. 4B illustrates bias conditions for erasing the drain side data region 155 of NROM cell 110. The drain side data region 155 may be erased in a manner similar to the method described in association with FIG. 3B. That is, drain side data region 155 of NROM cell 110 can be erased by applying a zero volt potential to the source terminal 121 and substrate terminal 116, a medium positive potential, e.g. about 5 volts, to the drain terminal 126, and a medium negative potential, e.g. about −5 volts, to the terminal 146 of word line 145 that forms a gate for the NROM cell 110. If other source/drain terminals remain floating, then, as already described in the discussion of FIG. 4A, these bias conditions cause the injection of hot holes into drain side data region 155 of the charge trapping layer 135. A similar method, with the roles of source and drain interchanged, may be used to erase source side data region 150.

Unfortunately, erasing drain side data region 155 of NROM cell 110 may cause a disturbance to source side data region 156 of adjacent NROM cell 111. This disturbance can result from a strong disturbing electric field that is established between the source 125 of NROM cell 111 and word line 145 that forms a gate for NROM cell 111. This disturbing electric field is approximately a mirror image of a similar field between the drain 125 and the word line 145 that also forms a gate for NROM cell 110. The disturbing electric field could accelerate holes from a depletion region around source/drain 125 resulting in hot holes that could be injected into source side data region 156 of NROM cell 111. Such a disturbance of an adjacent cell may not be an acceptable mode of operation for an NROM EEPROM.

In accordance with an aspect of the present invention, one way of modifying the disturbing electric field is to apply a small positive potential, e.g. about 3 volts, to the drain terminal 128 of NROM cell 111. The application of this small positive potential acts to reduce the magnitude of a lateral component of the disturbing electric field between the drain and source near an interface of the substrate 115 and the isolation layer 130 of NROM cell 111. This reduction means that holes near the interface, which are generated in the depletion layer around the source/drain 125, do not achieve sufficient kinetic energy to surmount the barrier of the isolation layer 130 and therefore do not reach source side data region 156. At the same time, differences between (a) the small positive potential applied to drain terminal 128 and (b) the potentials applied to source terminal 121 and/or drain terminal 126 are not sufficient to cause erasure of drain side data region 157 of NROM cell 111. As already suggested, this aspect of the present invention preferably applies to the operation of short-channel devices. If the channel is too long, then the reduction in magnitude of the lateral component of the disturbing electric field may not be significant. The method just described erases only drain side data region 155 of NROM cell 110 and disturbs neither the program state (i.e. either programmed or erased) of source side data region 150 in NROM cell 110 nor the program state of source side data region 156 and drain side data region 157 in NROM cell 111. Nor are the program states of data regions in NROM cell 109 affected. A similar method, wherein the roles of the source 120 and drain 125 are interchanged and the small positive potential is applied to source region 119, erases only source side data region 150 of NROM cell 110.

Figure 5:
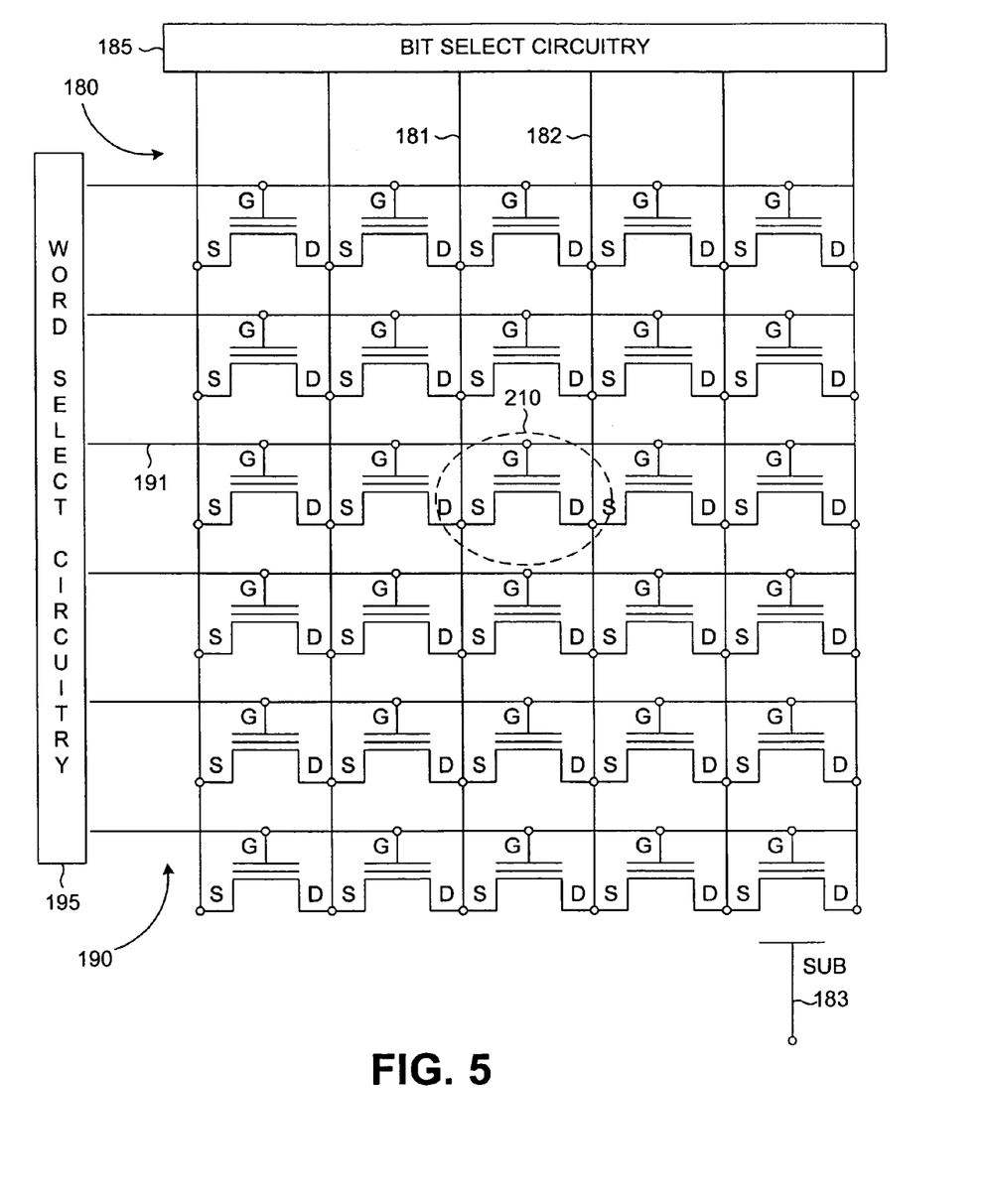
FIG. 5 is a schematic diagram that illustrates an embodiment of a virtual ground array of NROM cells.

FIG. 5 is a schematic diagram that illustrates an embodiment of a virtual ground array of NROM cells. Each cell, e.g. NROM cell 210, takes the form illustrated in FIGS. 2A and 2B, and each row of cells in the diagram takes the form illustrated in FIG. 4A. The source/drain regions (S, D) of NROM cells in a column are connected by bit lines 180. Individual bit lines 181 and 182 connect, respectively, to the source (S) and drain (D) of NROM cell 210. As described above, bit lines 180 may be formed as buried N+ diffusions in the substrate. Terminals (not separately designated in FIG. 5) on the bit lines may connect to bit select circuitry 185 that is capable of applying separate potentials to each bit line as part of a method of programming or erasing individual NROM cells in the array. The gates (G) of NROM cells in each row of the array are connected by word lines 190. According to the embodiment illustrated in FIG. 5, each row of the array comprises a word line, e.g. word line 191, that forms a gate for each NROM cell in the row. For instance, word line 191 forms a gate for NROM cell 210. Terminals (not specifically designated) on the word lines may connect to word select circuitry 195 that is capable of applying separate potentials to each word line as part of a method of programming or erasing individual NROM cells in the array. All the cells in the illustrated embodiment occupy the same substrate area, the substrate having a substrate terminal 183.

The principles elucidated above with regard to FIGS. 4A and 4B can be applied to programming and erasing elements, e.g. NROM cell 210, of a dense array of NROM cells of the type illustrated in FIG. 5. For example, NROM 210 can be programmed by applying appropriate potentials to bit lines 181 and 182 and to word line 191. Unless otherwise stated, potentials described with reference to FIGS. 5-7 are defined relative to the potential of the substrate terminal 183.

Figure 6:
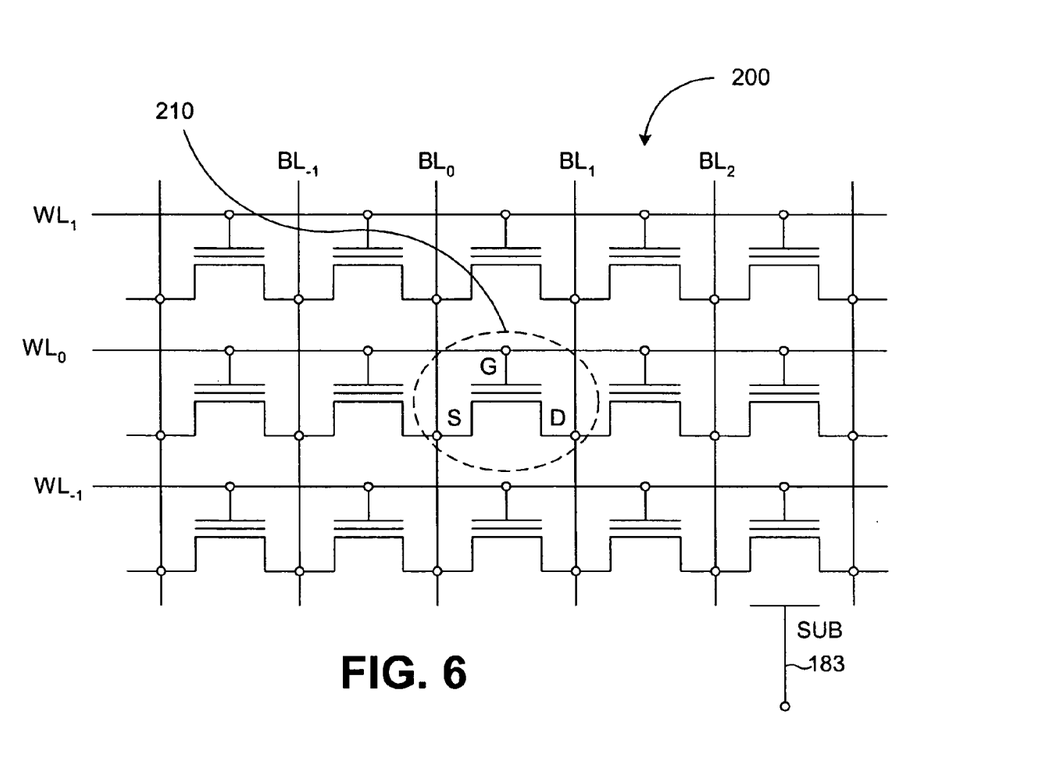
FIG. 6 is a schematic diagram of an embodiment of a reduced array of NROM cells.
Figure 7:
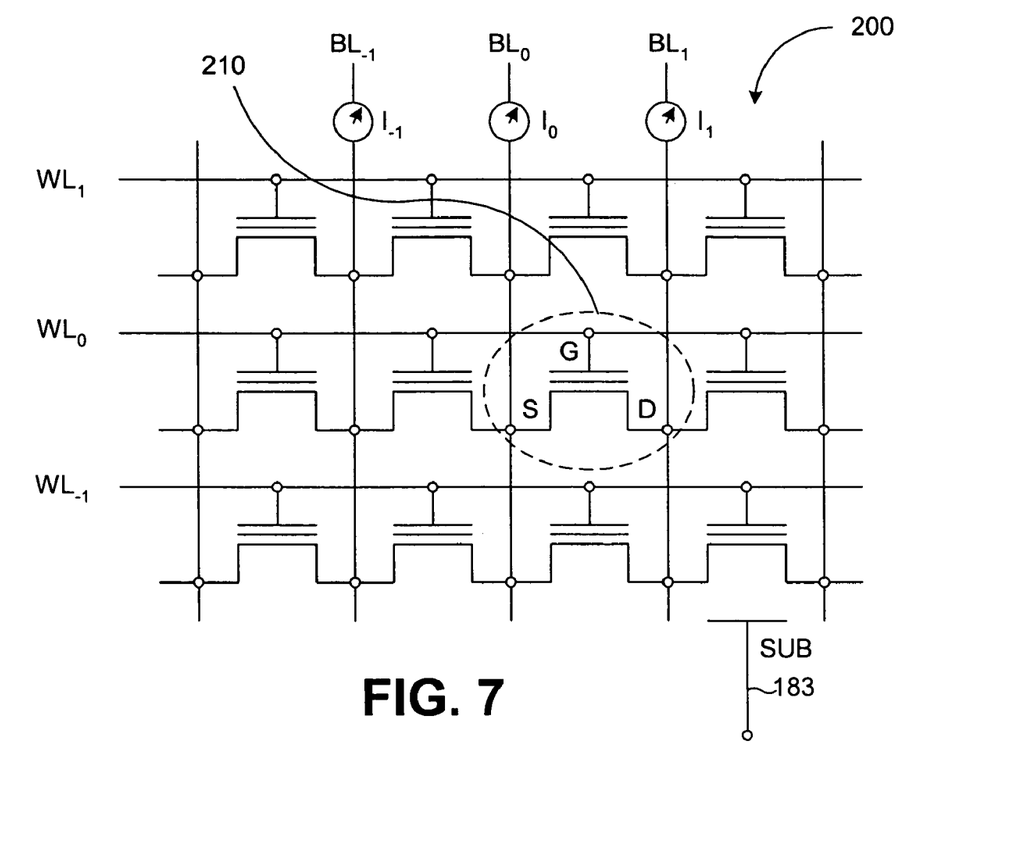
FIG. 7 is a schematic diagram of an embodiment of a reduced array of NROM cells that includes mechanisms for sensing current

FIG. 6 is a schematic diagram of an embodiment of a reduced virtual ground array 200 of NROM cells. The illustrated embodiment may be a subset of a larger array of the type illustrated in FIG. 5. Methods of operating an arbitrary NROM cell in the array according to the present invention will be described by referring to a single selected NROM cell 210 in the array 200.

The illustrated embodiment comprises bit lines $BL_{-1}$, $BL_0$, $BL_1$, and $BL_2$. Bit line $BL_0$ connects to the source (S) of NROM cell 210, bit line $BL_1$ connects to the drain (D) of NROM cell 210, and bit line $BL_{-1}$ connects to the source of an adjacent NROM cell, the drain of which coincides with the source (S) of NROM cell 210. Bit line $BL_2$ connects to the drain of an adjacent NROM cell, the source of which coincides with the drain (D) of NROM cell 210.

The illustrated embodiment further comprises word lines $WL_0$, $WL_1$, and $WL_{-1}$. Word line $WL_0$ connects to the gate (G) of NROM cell 210. (Stated alternatively, word line $WL_0$ forms the gate of NROM cell 210 and of all other NROM cells in the same row as NROM cell 210.) $WL_1$ connects the gates of all NROM cells in a row above and adjacent to the row occupied by NROM cell 210. Similarly, $WL_{-1}$ connects the gates of all NROM cells in a row below and adjacent to the row occupied by NROM cell 210.

According to the method already introduced, a drain side data region near the drain (D) of the NROM cell 210 may be programmed by applying suitable potentials to the source (S), drain (D), and gate (G) terminals of NROM cell 210. In FIG. 6 these potentials may be applied, respectively, to bit line $BL_0$ that connects to the source (S), to bit line $BL_1$ that connects to the drain (D), and to word line $WL_0$ that connects to the gate (G). All other bit lines may be allowed to float. As one example of the method, a first potential (about zero volts in this example) is applied to $BL_0$. A second potential (about 6 volts in this example) is applied to bit line $BL_1$, and a third potential (about 10 volts in this example) is applied to word line $WL_0$. A fourth potential (that may be the same as the first potential) can be applied to all other word lines. Comparison of this example with the method described in conjunction with FIGS. 2A and 2B confirms that the drain side data region of NROM cell 210 is programmed by the exemplary method just outlined.

A source side data region near the source (S) of NROM cell 210 can be programmed by a similar method wherein the roles of the source (S) and drain (D) in the previous example are interchanged. In particular, applying the first potential to bit line $BL_1$, the second potential to bit line $BL_0$, the third potential to word line $WL_0$, the fourth potential to all other word lines, and allowing all other bit lines to float causes the source side data region of NROM cell 210 to be programmed.

A drain side data region near the drain of the NROM cell 210 may be erased by applying suitable potentials to bit lines and word lines according to the method introduced in the description of FIG. 4B. An example of application of the method of FIG. 4B to the present configuration comprises applying a first potential (zero volts in this example) to $BL_0$. A second potential (about 5 volts in this example) is applied to $BL_1$. A third potential (about −5 volts in this example) is applied to $WL_0$. A fourth potential (about 3 volts in this example) is applied to $BL_2$. All other bit lines are allowed to float, and a fifth potential (which may be the same as the first potential) is applied to remaining word lines. Comparison with the method described in conjunction with FIG. 4B confirms that this method erases the drain side data region of NROM cell 210. Further, no other data region in the array 200 is disturbed by the application of the indicated potentials.

A source side data region near the source (S) of NROM cell 210 can be erased using a similar method by interchanging the roles of the source (S) and drain (D) in the previous example and applying the fourth potential to $BL_{-1}$ instead of $BL_2$. As a specific example, a first potential (zero volts in this example) is applied to $BL_1$, a second potential (about 5 volts in this example) is applied to $BL_0$, a third potential (about −5 volts in this example) is applied to $WL_0$, and a fourth potential (about 3 volts in this example) is applied to $BL_{-1}$. All other bit lines are allowed to float, and a fifth potential (which may be the same as the first potential) is applied to all remaining word lines. Application of the indicated potentials erases the source side data region of NROM cell 210, while not disturbing other data regions in the array 200.

The present invention further comprises a method of determining the program state of a data region in an NROM cell that may be a member of an array of the type illustrated in FIG. 5. Generally, determining a program state of a data region (referred to as "reading" the data region of the NROM cell) can comprise applying suitable potentials to the NROM cell and sensing a value of current in the source or drain of the NROM cell.

FIG. 7 is a schematic diagram of an embodiment of a reduced virtual ground array 200 of NROM cells that includes low-impedance mechanisms $I_{-1}$, $I_0$, and $I_1$ for sensing current. An illustrative example includes reading a drain side data region near the drain (D) of NROM cell 210. According to this example, a first potential (zero volts in this example) is applied to bit line $BL_1$, a second potential (about 1.6 volts in this example) is applied to bit line $BL_0$, and a third potential (about 3.3 volts in this example) is applied to word line $WL_0$. A fourth potential (that may be the same as the first potential) is applied to all remaining word lines, and the remaining bit lines are allowed to float. With these bias conditions, current $I_0$ is sensed. Under the indicated bias conditions, currents $I_0$, and $I_1$ are substantially equal (if not considering leakage paths in the array structure). Accordingly, $I_1$, rather than $I_0$, may be sensed in alternative embodiments. When binary data is stored in the drain side data region, the magnitude of current $I_0$ can be compared with a current threshold value, $I_{th}$. In a representative embodiment, a value of $I_{th}$ may be about 15 μA. When the magnitude of $I_0$ exceeds $I_{th}$, then a decision is made that the drain side data region is erased (i.e. is in a low $V_t$ state). Otherwise, a decision is made that the drain side data region is programmed (i.e. is in a high $V_t$ state).

A similar method can be applied to determine a program state of a source side data region near the source (S) of NROM cell 210 by interchanging the roles of the source (S) and drain (D). That is, a first potential (zero volts in this example) is applied to bit line $BL_0$, a second potential (about 1.6 volts in this example) is applied to bit line $BL_1$, and a third potential (about 3.3 volts in this example) is applied to word line $WL_0$. A fourth potential (that may be the same as the first potential) is applied to all remaining word lines, and the remaining bit lines are allowed to float. With these bias conditions, current $I_1$ is sensed. When binary data is stored in the drain side data region, the magnitude of $I_1$ can be compared with $I_{th}$. When the magnitude of $I_1$ exceeds $I_{th}$, then a decision is made that the source side data region is erased (i.e. is in a low $V_t$ state). Otherwise, a decision is made that the source side data region is programmed (i.e. is in a high $V_t$ state).

In an alternative embodiment of the array 200 of NROM cells, the data regions near the source (S) and drain (D) may store four-level values so that each data region can store two bits of information. In this instance, the reading method described above can be applied, provided additional cell threshold voltage $V_t$ levels are employed. For example, the method of reading a drain side data region may proceed as outlined above except that a value of the threshold voltage $V_t$ is determined by applying successively larger gate potentials until the sensed current $I_0$ is larger than $I_{th}$. According to an illustrative example, three gate potentials may have values $V_1$, $V_2$, and $V_3$ where the potential values are related to each other as $V_1 < V_2 < V_3$. When gate potential $V_1$ is applied, if $I_0$ has a magnitude greater than $I_{th}$, then a decision is made that the drain side data region is erased (i.e. in a low $V_t$ state). If, when gate potential $V_1$ is applied, $I_0$ has a magnitude smaller than $I_{th}$, then the gate potential may be increased to $V_2$, and the value of $I_0$ again may be sensed. If, under this condition, $I_0$ has a magnitude greater than $I_{th}$, then a decision is made that the drain side data region is programmed to a first level (i.e. to a relatively high $V_t$ state). If, when gate potential $V_2$ is applied, $I_0$ has a magnitude smaller than $I_{th}$, then the gate potential may be increased to $V_3$, and the value of $I_0$ again may be sensed. If, under this condition, $I_0$ has a magnitude greater than $I_{th}$, a decision is made that the drain side data region is programmed to a second level (i.e. to a relatively higher $V_t$ state). If, when gate potential $V_3$ is applied, $I_0$ has a magnitude less than $I_{th}$, then a decision is made that the drain side data region is programmed to a third level (i.e. to a highest $V_t$ state). Four distinguishable conditions comprising (1) erased, (2) programmed to first level, (3) programmed to second level, and (4) programmed to third level can be made to correspond to the values of two bits of data storage in the drain side data region. A similar method can be applied to reading four-level values stored in a source side data region near the source (S). The method just described may provide for storing four bits in a single NROM cell. It will be apparent to one skilled in the art that the method just described can be extended to more than four levels. For example, when eight levels are employed, then a single NROM cell can store 6 bits of information.

Another embodiment of an NROM cell with a single data region is similar to the NROM cell structure illustrated in FIG. 1A, but with a single data region, the drain side data region 55, and no source side data region 50. Alternatively, a single data region, the source side data region 50, may be used with no drain side data region 55. Either of these embodiments may employ at least two different sensing methods as described below.

In one embodiment of the array 200 of NROM cells, each NROM cell, e.g. NROM cell 210, can comprise a single data region (instead of two data regions) that may store either binary or multi-level data values. Programming in this case can be carried out using the method for programming either drain side data region 55 or source side data region 50 according to whether drain side data region 55 or source side data region 50 (FIG. 1A) stores data. A reading method in this embodiment can be the same method outlined above. As an example, and with continued reference to FIG. 7, when the drain side data region assumes either a programmed or an erased state, then reading can be accomplished by applying a first potential (zero volts in this example) to bit line $BL_1$, applying a second potential (about 1 volt in this example) to bit line $BL_0$, and applying a third potential (about 3.3 volts in this example) to word line $WL_0$. Since only one data region is used, this embodiment may employ a lower second potential than those used in the previous embodiments. A fourth potential (that may be the same as the first potential) should be applied to all remaining word lines. The remaining bit lines may be allowed to float. Under these bias conditions, the current $I_0$ can be sensed and its magnitude compared against one or more thresholds as already described to determine the program state of the drain side data region. When an NROM cell is operated in this one-sided manner, it may be possible to obtain a higher programmed $V_t$ as compared to two-sided manners of operation. In another implementation, with continued reference to FIG. 7, when the drain side data region takes on either a programmed or erased state, then reading can be accomplished by applying a first potential (zero volts in this example) to bit line $BL_0$, applying a second potential (about 1 volt in this example) to bit line $BL_1$, and applying a third potential (about 3.3 volts in this example) to word line $WL_0$. As above, a fourth potential (that may be the same as the first potential) can be applied to all remaining word lines, and the remaining bit lines may be allowed to float. Under these bias conditions, the current $I_0$ can be sensed and its magnitude compared against one or more thresholds as already described to determine the program state of the drain side data region. In this embodiment, it may be possible in one implementation not to use the typical NROM reverse read method. Also, in this case, which is but one possible operation method for use with EEPROM arrays such as described herein, it may be possible to use a much smaller drain potential than that used with traditional NROM algorithms.

In view of the foregoing, it will be understood by those skilled in the art that the methods of the present invention can facilitate formation of read only memory devices, and in particular read only memory devices exhibiting dual bit cell structures, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method, comprising:
providing a virtual ground array of nitride read only memory cells without isolation regions between cells, wherein the array of cells are arranged in a substrate according to rows and columns, each cell in the array comprising:
a source;
a drain;
a channel formed between the source and the drain;
a first isolating layer formed above the channel;
a charge trapping layer formed above the first isolating layer, the charge trapping layer having a first data region and a second data region;
a second isolating layer formed above the charge trapping layer; and
a gate formed above the second isolating layer;
wherein the gates of cells in each row are coupled to a common word line, the source of each cell in a row is configured to coincide with the drain of an adjacent cell in the row, the sources of cells in a column are connected to form a common bit line;
selecting a cell in the array; and
erasing or programming the first data region in the selected cell while all bit lines, excluding bit lines that are connected to the selected cell and one or more cells adjacent to the selected cell, are floated, wherein the second data region in the selected cell is not erased or programmed and no data region in any unselected cell in the array is erased or programmed.

2. The method as set forth in claim 1, wherein the erasing or programming of the first data region comprises erasing or programming a drain side data region.

3. The method as set forth in claim 2, wherein the erasing or programming of the drain side data region in the selected cell comprises:
applying a first potential to a first bit line connected to the source of the selected cell;
applying a second potential to a second bit line connected to the drain of the selected cell;
applying a third potential to a first word line connected to the gate of the selected cell; and
applying a fourth potential to one or more bit lines that are connected to one or more cells that are adjacent to the selected cell;
wherein all the applied potentials are referenced to the substrate, and
wherein, the charge trapping layer having a sufficiently low conductivity to prevent spreading of charge therein, a potential difference between (a) the fourth potential and (b) at least one of the first and second potentials is not sufficient to inject charges into any data region in the same row as the selected cell other than the drain side data region in the selected cell.

4. The method as set forth in claim 3, wherein:
the applying of a third potential comprises applying a third potential such that a difference between the second potential and the third potential is sufficient to cause holes to be injected from the drain of the selected cell into the drain side data region of the selected cell so as to cause a data value to be erased or programmed from the drain side data region of the selected cell; and
the applying of a third potential comprises applying a third potential such that a difference between the first potential and the third potential is not sufficient to cause holes to be injected from the source of the selected cell into the source side data region of the selected cell.

5. The method as set forth in claim 3, wherein the erasing or programming of the drain side data region in the selected cell further comprises:
applying a fifth potential to all word lines not coupled to the gate of the selected cell; and allowing all remaining bit lines to float, wherein:
a difference between the fourth potential and the second potential is not sufficient to cause holes to enter a data region in an adjacent cell;
a difference between the fourth potential and the first potential is not sufficient to cause holes to enter a data region in an adjacent cell;
a difference between the first potential and the fifth potential is not sufficient to cause holes to enter a data region in any unselected cell having the same bit line as the selected cell;
a difference between the second potential and the fifth potential is not sufficient to cause holes to enter a data region in any unselected cell having the same bit line as the selected cell; and a difference between the fourth potential and the fifth potential is not sufficient to cause holes to enter a data region in any unselected cell.

6. The method as set forth in claim 1, wherein the erasing or programming of the first data region comprises erasing or programming a source side data region.

7. The method as set forth in claim 6, wherein the erasing or programming of the source side data region in the selected cell comprises:
  applying a first potential to a first bit line connected to the drain of the selected cell;
  applying a second potential to a second bit line connected to the source of the selected cell;
  applying a third potential to a first word line connected to the gate of the selected cell; and
  applying a fourth potential to one or more bit lines that are connected to one or more cells that are adjacent to the selected cell;
  wherein all the applied potentials are referenced to the substrate, and
  wherein, the charge trapping layer having a sufficiently low conductivity to prevent spreading of charge therein, a potential difference between (a) the fourth potential and (b) at least one or the first and second potentials is not sufficient to inject charges into any data region in the same row as the selected cell other than the source side data region in the selected cell.

8. The method as set forth in claim 7, wherein:
  the applying of a third potential comprises applying a third potential such that a difference between the second potential and the third potential is sufficient to cause holes to be injected from the source of the selected cell into the source side data region of the selected cell so as to cause a data value to be erased or programmed from the source side data region of the selected cell; and
  the applying of a third potential comprises applying a third potential such that a difference between the first potential and the third potential is not sufficient to cause holes to be injected from the drain of the selected cell into the drain side data region of the selected cell.

9. The method as set forth in claim 7, wherein the erasing or programming of the source side data region in the selected cell further comprises:
  applying a fifth potential to all word lines not coupled to the gate of the selected cell; and allowing all remaining bit lines to float, wherein:
    a difference between the fourth potential and the second potential is not sufficient to cause holes to enter a data region in an adjacent cell;
    a difference between the fourth potential and the first potential is not sufficient to cause holes to enter a data region in an adjacent cell;
    a difference between the first potential and the fifth potential is not sufficient to cause holes to enter a data region in any unselected cell having the same bit line as the selected cell;
    a difference between the second potential and the fifth potential is not sufficient to cause holes to enter a data region in any unselected cell having the same bit line as the selected cell; and
    a difference between the fourth potential and the fifth potential is not sufficient to cause holes to enter a data region in any unselected cell.

10. The method as set forth in claim 1, wherein the erasing or programming of the first data region comprises:
  applying a first potential to a first bit line connected to the source of the selected cell;
  applying a second potential to a second bit line connected to the drain of the selected cell; and
  applying a third potential to a word line connected to the gate of the selected cell;
  wherein the selected cell is turned on at a cell current under the third potential, and the first and third potentials are sufficient to cause hot electrons to be injected into the first data region of the selected cell so as to erase or program the first data region of the selected cell.

11. The method as set forth in claim 1, wherein the erasing or programming of the first data region comprises causing a threshold potential to assume one of a plurality of values.

12. The method as set forth in claim 11, wherein causing a threshold potential to assume one of a plurality of values comprises causing the threshold potential to assume one of two values.

13. The method as set forth in claim 11, wherein causing a threshold potential to assume one of a plurality of values comprises causing the threshold potential to assume one of four values.

14. The method as set forth in claim 10, further comprising:
  applying a fourth potential to other word lines; and
  allowing other bit lines to float, wherein the first potential, second potential, and fourth potential on word lines connected to unselected cells in the same column as the selected cell do not cause hot electrons to enter a data region in any unselected cell in the same column as the selected cell.

15. The method as set forth in claim 1, further comprising:
  applying a first potential to a first bit line connected to one of the source or the drain of the selected cell;
  applying a second potential to a second bit line connected to one of the source or the drain that is not coupled to the first bit line of the selected cell;
  applying a first gate potential to a first word line connected to the gate of the selected cell;
  applying a third potential to other word lines;
  sensing a first current; and
  deciding a program state of a data region according to a value of the sensed first current.

16. The method as set forth in claim 15, wherein the deciding comprises deciding that the program state of the data region is in an erased state when the value of the sensed first current exceeds a current threshold value.

17. The method as set forth in claim 16, when the value of the sensed first current does not exceed the current threshold value, the method further comprises:
  applying a second gate potential to the first word line, the second gate potential being larger than the first gate potential;
  sensing a second current; and
  deciding the program state of the data region according to a value of the sensed second current.

18. The method as set forth in claim 17, when a value of the sensed second current does not exceed the current threshold value, the method further comprises:
  applying a third gate potential to the first word line, the third gate potential being larger than the second gate potential;
  sensing a third current; and
  deciding the program state of the data region according to a value of the sensed third current.

19. The method as set forth in claim 18, wherein a decision is made that the program slate of the data region is programmed at a first level when the value of the sensed first current under the first gate potential is smaller than the given current threshold value and the value of the sensed second current under the second gate potential is larger than the given current threshold value.

20. The method as set forth in claim 19, wherein a decision is made that the program state of the data region is programmed at a second level when the value of the sensed second current under the second gate potential is smaller than the given current threshold value and the value of the sensed third current under the third gate potential is larger than the given current threshold value.

21. The method as set forth in claim 20, wherein a decision is made that the program state of the data region is programmed at a third level when the value of the sensed third current under the third gate potential is smaller than the given current threshold value.

* * * * *